United States Patent
Pribylov

(10) Patent No.: US 8,122,318 B2
(45) Date of Patent: Feb. 21, 2012

(54) DECODING APPARATUS AND METHOD FOR A PERFECT DIFFERENCE-SET CYCLIC CODE AND A DIFFERENCE-SET CYCLIC CODE

(75) Inventor: Vasily Pribylov, Suwon-si (KR)

(73) Assignee: Samsung Electronics Co., Ltd (KR)

( * ) Notice: Subject to any disclaimer, the term of this patent is extended or adjusted under 35 U.S.C. 154(b) by 996 days.

(21) Appl. No.: 12/059,338

(22) Filed: Mar. 31, 2008

(65) Prior Publication Data

US 2008/0244365 A1    Oct. 2, 2008

(30) Foreign Application Priority Data

Mar. 30, 2007 (KR) .................. 10-2007-0031473

(51) Int. Cl.
*G06F 11/00* (2006.01)
(52) U.S. Cl. ...................... 714/760; 714/808
(58) Field of Classification Search .............. 714/760, 714/808
See application file for complete search history.

(56) References Cited

U.S. PATENT DOCUMENTS

| | | | | |
|---|---|---|---|---|
| 3,475,724 A | * | 10/1969 | Townsend et al. ........... | 714/760 |
| 3,639,901 A | * | 2/1972 | Mitchell ..................... | 714/760 |
| 4,630,271 A | | 12/1986 | Yamada | |
| 4,672,612 A | * | 6/1987 | Shishikura et al. .......... | 714/760 |
| 4,675,868 A | | 6/1987 | Shishikura et al. | |
| 5,157,671 A | * | 10/1992 | Karplus ...................... | 714/752 |
| 5,574,735 A | | 11/1996 | Takada et al. | |
| 5,956,628 A | * | 9/1999 | Owaki ....................... | 455/158.4 |

FOREIGN PATENT DOCUMENTS

| JP | 60090430 A | * | 5/1985 |
|---|---|---|---|
| JP | 07162319 A | * | 6/1995 |

OTHER PUBLICATIONS

Weldon Jr., E.J., "Difference-Set Cyclic Codes", 1966 [http://www.alcatel-lucent.com/bstj/vol45-1966/articles/bstj45-7-1045.pdf].*

* cited by examiner

*Primary Examiner* — Gabriel Chu
(74) *Attorney, Agent, or Firm* — The Farrell Law Firm, P.C.

(57) ABSTRACT

A decoding apparatus includes a decoder register for receiving data having a codeword including null data bits, and decoding the received data while shifting Bit Under Decoding (BUD) by one bit. A connection unit outputs a check result by applying a predetermined check equation to the data output from the decoder register. A majority logic unit for determines if an error is detected according to the check result output from the connection unit, and outputs the determination result. An error information unit determines if there is an error in the received data and if there is an uncorrectable error in the decoded data.

8 Claims, 7 Drawing Sheets

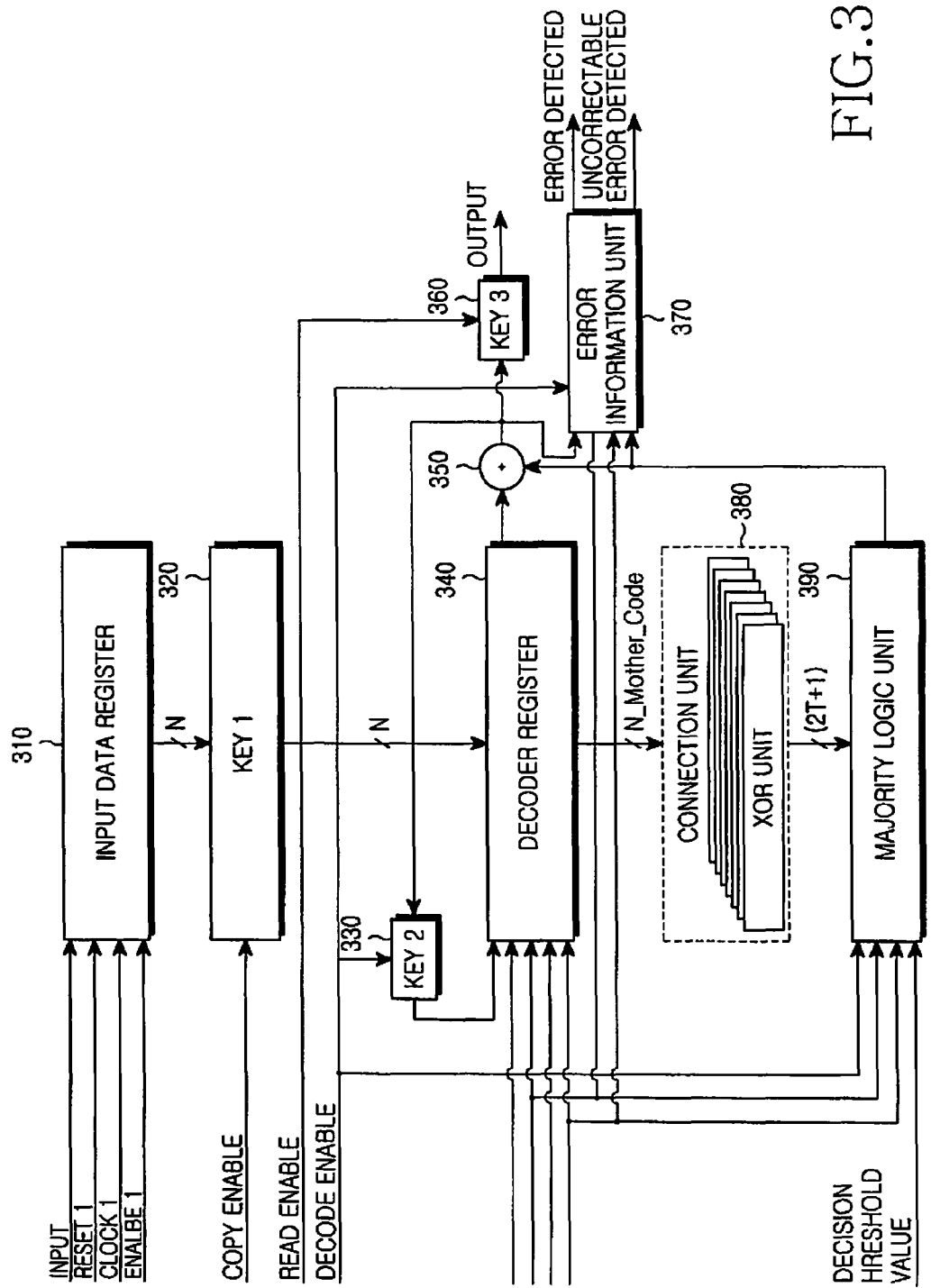

DECODING APPARATUS AND METHOD FOR A PERFECT DIFFERENCE-SET CYCLIC CODE AND A DIFFERENCE-SET CYCLIC CODE

PRIORITY

This application claims priority under 35 U.S.C. §119(a) to a Korean Patent Application filed in the Korean Intellectual Property Office on Mar. 30, 2007 and assigned Serial No. 2007-31473, the disclosure of which is incorporated herein by reference.

BACKGROUND OF THE INVENTION

1. Field of the Invention

The present invention relates generally to a decoding apparatus and method, and in particular, to a decoding apparatus and method using a Perfect Difference-Set Cyclic (PDSC) code.

2. Description of the Related Art

The present invention is directed to a decoding method for a Perfect Difference-Set Cyclic (PDSC) code and/or a Difference-Set Cyclic (DSC) code used for a communication and data storage system. A PDSC (184,102 version) code, one of the above codes, is a shortened version of a PDSC (273,191 version) code, and used for Integrated Service Digital Broadcasting-Terrestrial (ISDB-T) and ISDB-Terrestrial sound broadcasting for radio (ISDB-Tsb) systems, Japanese Digital Terrestrial Television and Radio Broadcasting, etc.

The PDSC code can be expressed as (n, k, s). (7,3,1), (21,11,2), (73,45,3), (273,191,4), (1057,813,5), and (4161, 3431,6) are well-known PDSC codes (n, k, s). Herein, 'n' denotes the number of codeword bits, 'k' denotes the number of information bits, and 's' denotes a non-negative integer. n and k are defined as shown in Equation (1).

$$n = 2^s \times (2^s + 1) + 1$$
$$k = n - (3^s + 1) = 2^s \times (2^s + 1) - 3^s \quad (1)$$

The shortened code such as PDSC (184,102 version) code and also the codes expressed by Equation (1) can be decoded using a decoder illustrated in FIG. 1.

Referring to FIG. 1, key blocks 110, 120, and 160 pass or block input signals according to an enable/disable control signal provided from the exterior. Exclusive OR (XOR) units 130 and 150, which receive two signals. The exterior. XOR units 130 and 150 output '0' when the two received signals are equal, and output '1' when the two received signals are different. A decoder register 140 is a shift register including n_mother_code cells, where the n_mother_code is a length of a codeword defined by Equation (1).

A connection unit 170 includes (2t+1) XOR units, where 't' is defined by Equation (2) and is an error correction capability of the PDSC code.

$$t = 2^{s-1} \quad (2)$$

The XOR units of the connection unit 170, each of which corresponds to a single decoder check equation, receive (2t+1)-bit data and output a 1-bit result value. For example, in the PDSC (273,191) code, a first check equation w(0) called a 'basic polynomial' is defined as shown in Equation (3).

$$w(0) = b272\char`\^b254\char`\^b248\char`\^b226\char`\^b222\char`\^b205\char`\^b169\char`\^b160\char`\^b157\char`\^$$
$$b146\char`\^b144\char`\^b113\char`\^b106\char`\^b105\char`\^b86\char`\^b76\char`\^b71 \quad (3)$$

In Equation (3), b0-b272 correspond to the number of bits stored in the decoder register 140.

A Perfect Difference-Set (PDS) P is defined as shown in Equation (4).

$$P = \{0,18,24,46,50,67,103,112,115,126,128,159,166, \\ 167,186,196,201\} \quad (4)$$

Other 2t check equations w(i) can be defined as shown in Equation (5).

$$w(i) = (w(0) * x^{Pi}) \text{ modulo } n\_mother\_code \quad (5)$$

For example, a connection unit of a PDSC (273,191) code and its shortened code performs a decoder matrix including 17 check equations defined as shown in Equation (6).

$$w(0) = XOR\{272, 254, 248, 226, 222, 205, 169, \quad (6)$$
$$160, 157, 146, 144, 113, 106, 105, 8, 6, 76, 71\};$$
$$w(1) = XOR\{272, 266, 244, 240, 223, 187, 178, 175,$$
$$164, 162, 131, 124, 123, 104, 9, 4, 89, 17\};$$
$$w(2) = XOR\{272, 250, 246, 229, 193, 184, 181, 170,$$
$$168, 137, 130, 129, 110, 100, 9, 5, 23, 5\};$$
$$w(3) = XOR\{272, 268, 251, 215, 206, 203, 192, 190,$$
$$159, 152, 151, 132, 122, 117, 4, 5, 27, 21\};$$
$$w(4) = XOR\{272, 255, 219, 210, 207, 196, 194, 163,$$
$$156, 155, 136, 126, 121, 49, 31, 25, 3\};$$
$$w(5) = XOR\{272, 236, 227, 224, 213, 211, 180, 173,$$
$$172, 153, 143, 138, 66, 48, 42, 20, 16\};$$
$$w(6) = XOR\{272, 263, 260, 249, 247, 216, 209, 208,$$
$$189, 179, 174, 102, 84, 78, 56, 52, 35\};$$
$$w(7) = XOR\{272, 269, 258, 256, 225, 218, 217,$$
$$198, 188, 183, 111, 93, 87, 65, 61, 44, 8\};$$
$$w(8) = XOR\{272, 261, 259, 228, 221, 220, 201,$$
$$191, 186, 114, 96, 90, 68, 64, 47, 11, 2\};$$
$$w(9) = XOR\{272, 270, 239, 232, 231, 212, 202, 197,$$
$$125, 107, 101, 79, 75, 58, 22, 13, 10\};$$
$$w(10) = XOR\{272, 241, 233, 214, 204, 199, 127,$$
$$109, 103, 81, 77, 60, 24, 15, 12, 1\};$$
$$w(11) = XOR\{272, 265, 264, 245, 235, 230, 158,$$
$$140, 134, 112, 108, 91, 55, 46, 43, 32, 30\};$$
$$w(12) = XOR\{272, 271, 252, 242, 237, 165, 147,$$
$$141, 119, 115, 98, 62, 53, 50, 39, 37, 6\};$$
$$w(13) = XOR\{272, 253, 243, 238, 166, 148, 142,$$
$$120, 116, 99, 63, 54, 51, 40, 38, 7, 0,\};$$
$$w(14) = XOR\{272, 262, 257, 185, 167, 161, 139,$$
$$135, 118, 82, 73, 70, 59, 57, 26, 19, 18\};$$
$$w(15) = XOR\{272, 267, 195, 177, 171, 149, 145,$$
$$128, 92, 83, 80, 69, 67, 36, 29, 28, 9\};$$
$$w(16) = XOR\{272, 200, 182, 176, 154, 150, 133,$$
$$97, 88, 85, 74, 72, 41, 34, 33, 14, 4\}.$$

A majority logic unit 180 receives (2t+1)-bit data and outputs 1-bit data. Basically, if a sum of input values output from a connection unit 170 is greater than or equal to a particular threshold, the majority logic unit 180 outputs '1', which indicates error detection on Bit Under Decoding (BUD). However, if the sum of input values is less than the particular threshold, the majority logic unit 180 outputs '0', which indicates no-error detection on BUD.

FIG. 2 is a flowchart illustrating an operation of a decoder according to the prior art. More specifically, with reference to FIG. 2, a description will be made of an operation in the decoder illustrated in FIG. 1.

Referring to FIG. 2, in step 200, the decoder resets the decoder register 140 to a 'zero' state for initialization. In step 205, the decoder inputs n-bit data to the decoder register 140. In this case, the key input unit 120 passes an input n-byte data signal according to an input 'write enable' active signal; the key input unit 110 passes a feedback signal according to an input 'decode enable' active signal; and the key input unit 160 blocks an input signal according to a 'read enable' passive signal. In step 210, the decoder sets a BUD number to zero, and then starts decoding.

In step 215, the decoder determines if all of k bits (where k denotes the number of information bits) have been decoded. That is, the decoder determines if the number, i.e., "BUD number," of currently decoded bits is less than the number of k bits (BUD number<k). If it is determined in step 215 that the BUD number is less than k, in step 220, the connection unit 170 uses equation 2t+1 to calculate a check result. In step 225, the connection unit 170 calculates a sum of the check results, and in step 230, the majority logic unit 180 determines if the calculated sum of check results is greater than or equal to a decision threshold, using an error detection method. If it is determined in step 230 that the calculated sum of check results is greater than the decision threshold, the decoder performs bit error correction in BUD in step 235, determining that an error is detected. However, if it is determined in step 230 that the calculated sum of check results is not greater than the decision threshold, the decoder determines that no error is detected, and does not have to perform error correction in step 235.

In step 240, as a 'read enable' value transitions to an active state, the key input unit (key 3) 160 outputs an input decoding result. In step 245, the decoder shifts data of the decoder register 140 by one bit and increases the BUD number by 1. Thereafter, the decoder again determines if all k bits have been decoded in step 215.

However, if it is determined in step 215 that all the k bits have been decoded, the decoder ends the decoding operation of the currently received codeword in step 250.

The foregoing conventional PDSC code-based decoding scheme can be classified mainly into two types according to the hard-input data (bi-level) such as High and Low, and the soft-input data (multi-level) such as 0.787 and 0.335.

Application of the soft-input approach, such as a Belief Propagation (BP) decoding algorithm, improves a Bit Error Rate (BER), but increases hardware complexity, thereby increasing manufacturing costs. However, application of the general hard-input technology decreases the cost of manufacturing due to its relatively simple hardware, but may cause a poor BER.

In addition, certain decoding schemes may apply only the hard-input approach rather than the soft-input approach. In this case, there is no way to improve the BER.

SUMMARY OF THE INVENTION

The present invention has been designed to address at least the problems and/or disadvantages and to provide at least the advantages described herein. Accordingly, an aspect of the present invention is to provide an apparatus and method for improving a Bit Error Rate (BER) of a Perfect Difference-Set Cyclic (PDSC) code using iterative hard-decision decoding while consuming less power.

In accordance with an aspect of the present invention, a decoding method includes receiving codeword bits including null data bits, and performing decoding on the received codeword bits while shifting Bit Under Decoding (BUD) by one bit; performing error detection and correction on each BUD; detecting an uncorrectable error when BUD is a null decoding bit; and outputting a decoding result.

In accordance with another aspect of the present invention, a decoding apparatus includes a decoder register for receiving data having a codeword including null data bits, and decoding the received data while shifting Bit Under Decoding (BUD) by one bit; a connection unit for outputting a check result by applying a predetermined check equation to the data output from the decoder register; a majority logic unit for determining if an error is detected based on the check result output from the connection unit, and outputting a determination result; and an error information unit for determining if there is an error in the received data and whether there is an uncorrectable error in the decoded data.

BRIEF DESCRIPTION OF THE DRAWINGS

The above and other aspects, features, and advantages of the present invention will become more apparent from the following detailed description when taken in conjunction with the accompanying drawings in which:

FIG. 3 is a block diagram illustrating an internal structure of a decoder according to an embodiment of the present invention;

DETAILED DESCRIPTION OF PREFERRED EMBODIMENTS

Figure 1:
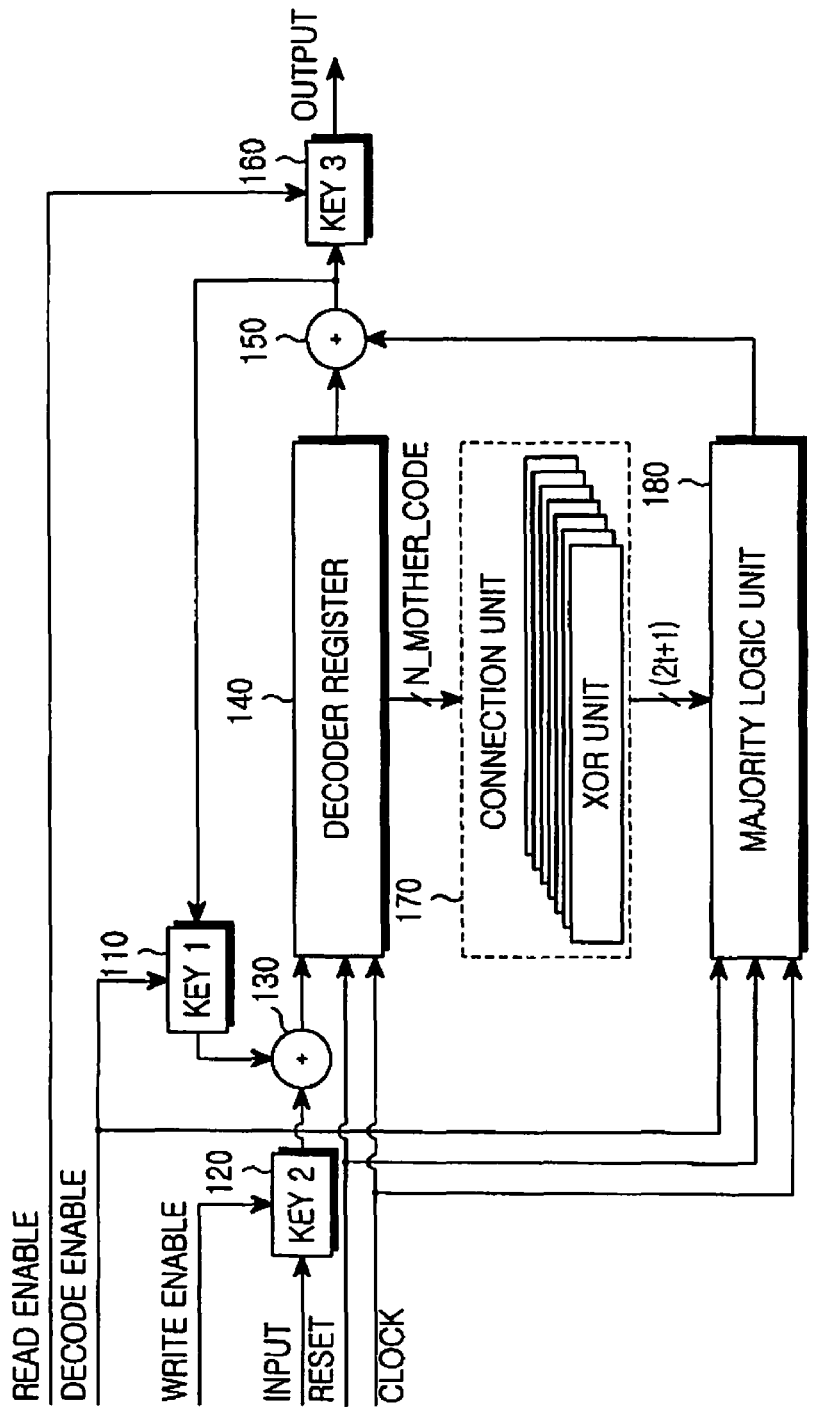
FIG. 1 is a block diagram illustrating an internal structure of a decoder according to the prior art.
Figure 2:
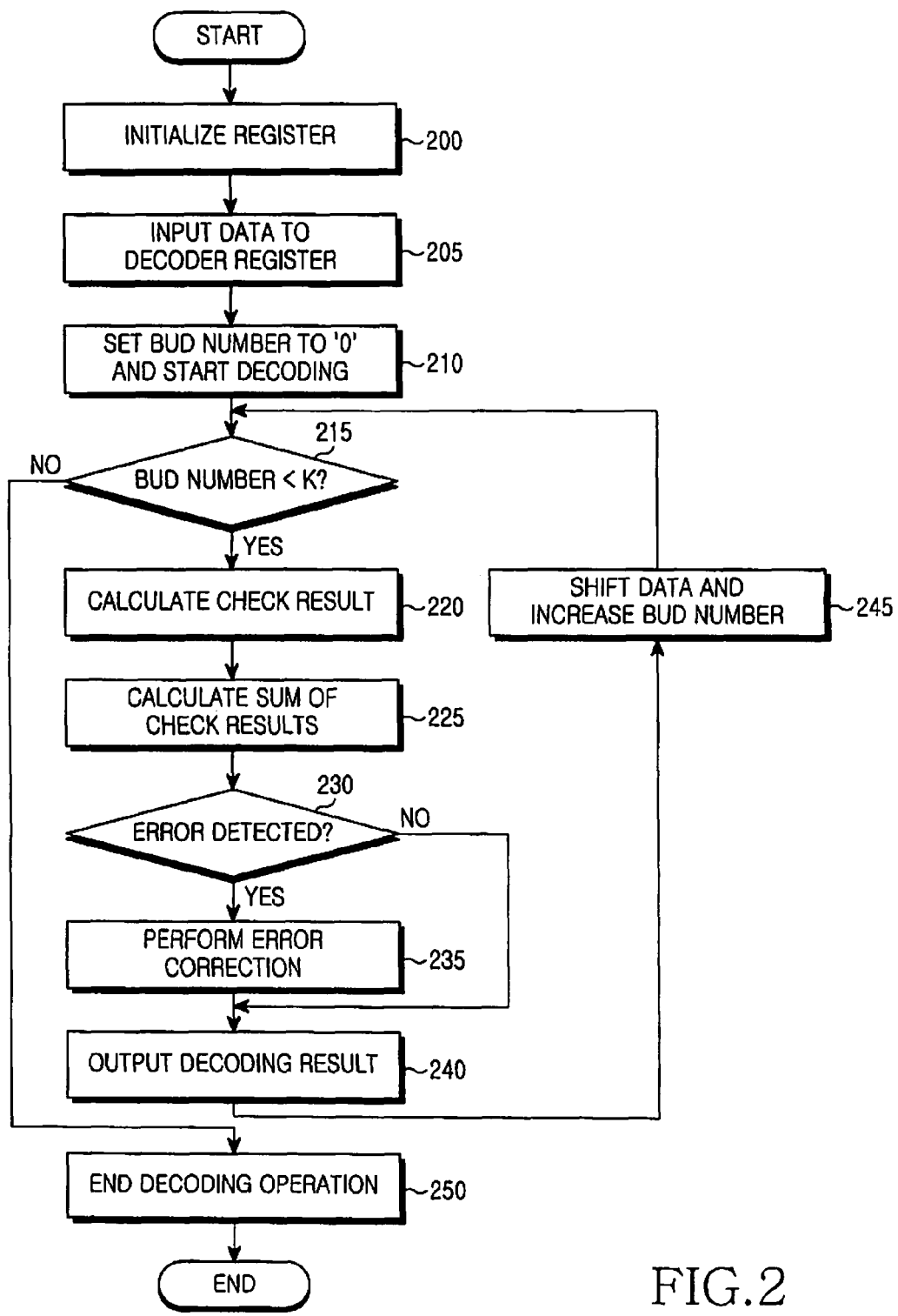
FIG. 2 is a flowchart illustrating an operation of a decoder according to the prior art.

Preferred embodiments of the present invention will now be described in detail with reference to the annexed drawings. In the following description, a detailed description of known functions and configurations incorporated herein has been omitted for clarity and conciseness. Terms used herein are defined based on functions in the present invention and may vary according to users, operator intentions, or usual practices. Therefore, the definition of the terms should be made based on the content throughout the specification.

A PDSC code used in a certain case can be a shortened version of a PDSC mother code having parameters calculated using Equation (1) as though PDSC (184,102) is a shortened version of PDSC (273,191). In this situation, a decoder needs to add 89-bit null data to the front of the Most Significant Bit (MSB) data, and the conventional decoder outputs only the decoded information data, omitting the decoded null data. However, the decoded null data is used for checking error occurrences in a sequence, thereby making it possible to increase reliability of the decoded data. That is, using the decoded null data may discover another error that would go uncorrected in the above-described conventional decoding method.

The optimal threshold of the PDSC mother code can be a value obtained by dividing a code distance d defined as shown in Equation (7), by 2.

$$d = 2^s + 2 \tag{7}$$

For PDSC (273,191), because s=4, d=18. Therefore, the optimal threshold is 18/2=9. Accordingly, when a sum of check results by the connection unit 170 is 9 or greater, it is not possible to perform error correction without inverting BUD. However, in order to obtain the best error correction performance for transition from the mother code up to the shortened code, a plurality of logic gate thresholds can be optimized. In addition, it is possible to improve BER performance using the decoding technology known as iterative decoding. The iterative decoding scheme reuses an output component of a decoder as an input for the next decoding. In order to use such an iterative decoding scheme, it is required to set a decision threshold to the maximum value (2t+1). Further, the iterative decoding scheme reduces n_mother_code bits by 1 bit, in order to minimize d/2 for each iteration.

FIG. 3 is a block diagram illustrating a structure of a decoder for decoding a PDSC code proposed by the present invention.

Referring to FIG. 3, an input data register 310, e.g., a shift register, stores a received n-bit codeword. A first key (key 1) 320 parallel-transfers data from the input data register 310 to a decoder register 340 according to a 'copy enable' signal from the exterior. When data is parallel-transferred from the input data register 310 to the decoder register 340, the decoder register 340 operates in a parallel write mode. Further, in order to decode the data, the decoder register 340 should be switched to a serial decoding mode.

A connection unit 380 performs an XOR operation. XOR units included in the connection unit 380, each of which corresponds to a single decoder check equation, receive (2t+1)-bit data and output 1-bit data. A majority logic unit 390 receives (2t+1)-bit data and outputs 1-bit data, and determines if a sum of inputs is greater than or equal to a particular threshold. If the sum of inputs is greater than or equal to the particular threshold, the majority logic unit 390 sets its output to '1', determining that an error is detected in BUD. However, if the sum of inputs is not greater than or equal to the particular threshold, the majority logic unit 390 sets its output to '0', determining that no error is detected in BUD. An error information unit 370 determines if there is any error in the received data and if there is any uncorrected error in the decoded data.

A difference between the conventional technology and the present invention is that the present invention can control and change a decision threshold for each new iterative decoding. Therefore, the present invention improves BER performance for the hard-input approach. The present invention aims to improve BER performance, and reduce the number of iterations to reduce power consumption. The number of iterations can be fixed or changed during an operation of the decoder.

Figure 4A:
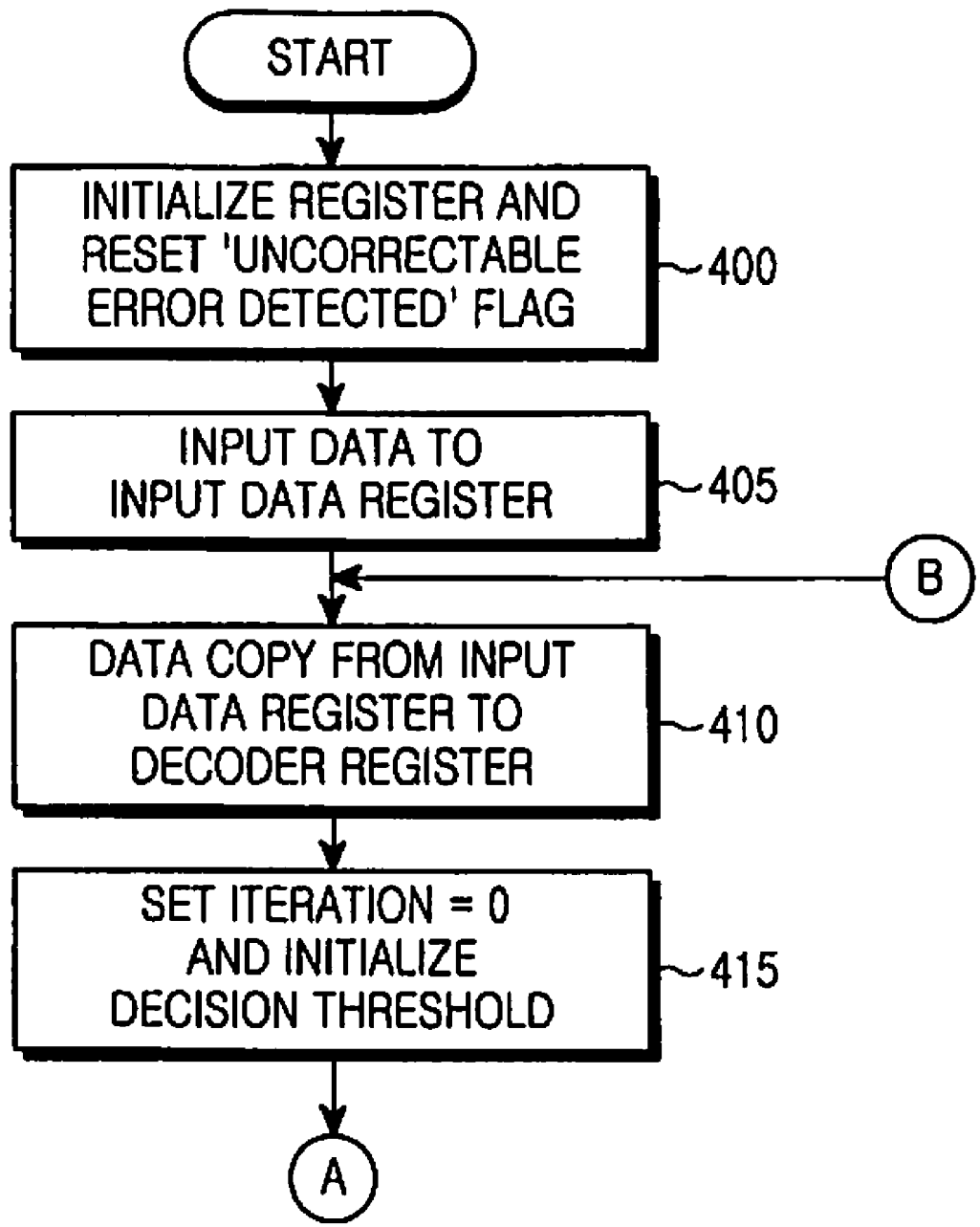
FIGS. 4A and 4B are flowcharts illustrating an operation of decoder according to an embodiment of the present invention.
Figure 4B:
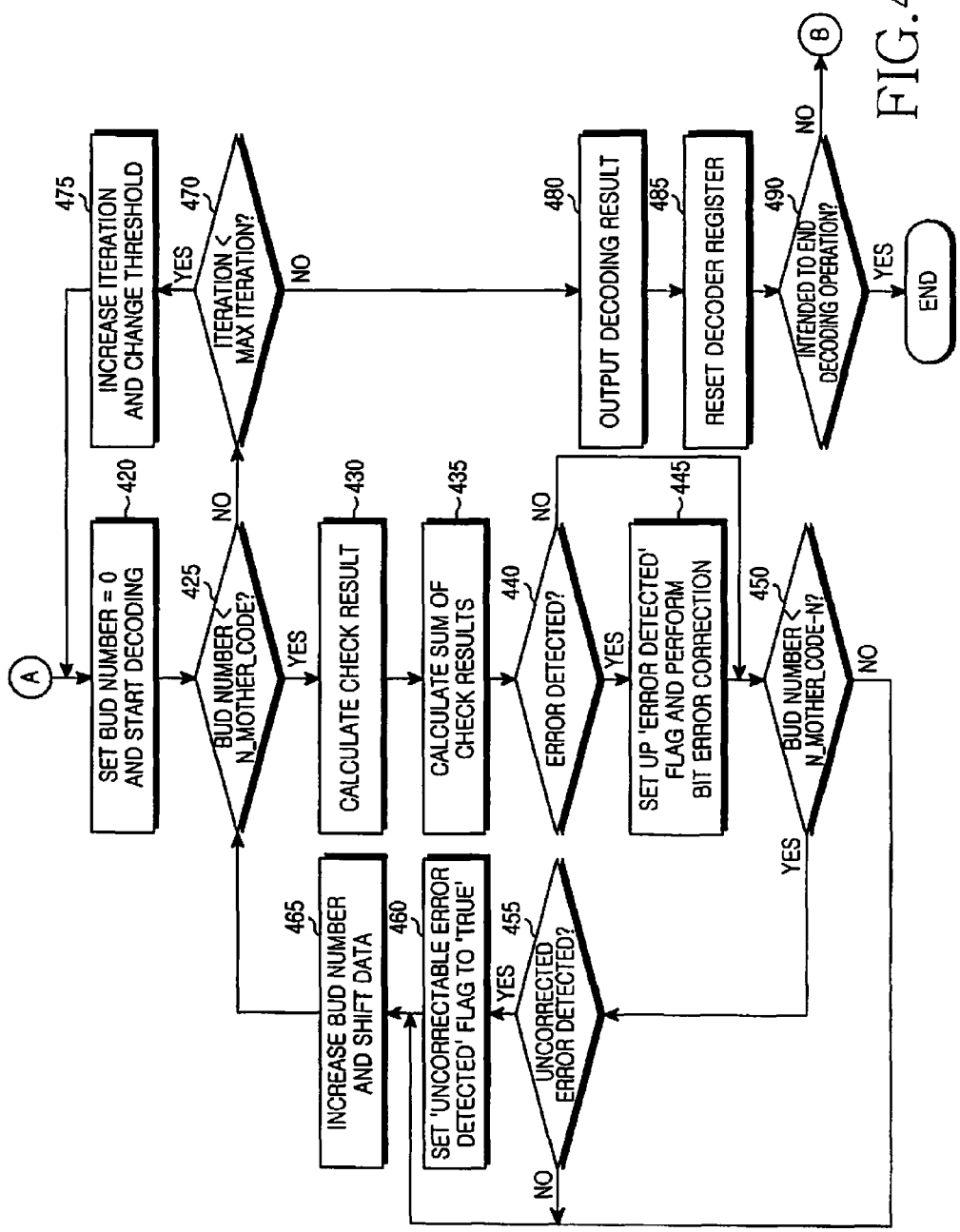

FIGS. 4A and 4B are flowcharts illustrating an operation of decoder according to an embodiment of the present invention.

Referring to FIG. 4A, in step 400, the decoder resets the decoder register 340 to a 'zero' state for initialization. Herein, the decoder resets an 'Uncorrectable Error Detected' flag added in the present invention to '0'. In step 405, n-bit data is input to the input data register 310 according to an "Enable" active signal. In step 410, the decoder copies (parallel-transfers) the n-bit data from the input data register 310 to the decoder register 340. In step 415, the decoder sets the number of iterations to zero, and sets a decision threshold to an initialized state.

Referring to FIG. 4B, in step 420, the decoder sets a BUD number to zero, and starts decoding. In step 425, the decoder determines if all of n_mother_code bits have undergone decoding, i.e., if the BUD number is not less than the n_mother_code. If it is determined in step 425 that not all the n_mother_code bits have been decoded, i.e., if the BUD number is less than the n_mother_code, the connection unit 380 uses equation 2t+1 to calculate a check result in step 430. In step 435, the connection unit 380 calculates a sum of check results, and the majority logic unit 390 determines in step 440 if an error is detected. Specifically, the majority logic unit 390 determines in step 440 if the calculated sum of check results is greater than or equal to a decision threshold, to check error detection. If it is determined in step 440 that the calculated sum of check results is greater than or equal to the decision threshold, i.e., if an error is detected, the error information unit 370 performs bit error correction in BUD and sets up an 'Error Detected' flag in step 445. However, if it is determined in step 440 that the calculated sum of check results is not greater than or equal to the decision threshold, i.e., no error is detected, the decoder skips the bit error correction in step 445.

In step 450, the error information unit 370 determines if the BUD number is less than n_mother_code-n. If it is determined in step 450 that the BUD number is less than n_mother_code-n, the error information unit 370 determines if an uncorrected error is detected in step 455. However, if it is determined in step 450 that the BUD number is greater than or equal to n_mother_code-n, the decoder proceeds to step 465.

However, if it is determined in step 455 that an uncorrected error is detected, the decoder sets up an 'Uncorrectable Error Detected' flag in step 460, and then proceeds to step 465. However, if it is determined in step 455 that no uncorrected error is detected, the decoder jumps to step 465. In step 465, the decoder shifts data of the decoder register 340 by one bit and increases the BUD number by 1, and then proceeds to step 425.

However, if it is determined in step 425 that the BUD number is greater than or equal to n_mother_code, the decoder determines if the current number of iterations is less than the maximum number of iterations in step 470. If it is determined in step 470 that the current number of iterations is less than the maximum number of iterations, the decoder increases the number of iterations by 1 and changes the decision threshold in step 475.

However, if it is determined in step 470 that the current number of iterations is greater than or equal to the maximum number of iterations, the decoder outputs decoded k bits in step 480, resets the decoder register 340 in step 485, and then determines if it will end the decoding operation in step 490. Based on the determination result, the decoder ends the decoding operation or returns to step 410.

For verification of the proposed method, a channel codec is implemented with a C/C++ program. Herein, an Additive White Gaussian Noise (AWGN) channel model is applied, and the applied modulation method is Binary Phase Shift Keying (BPSK).

Figure 5:
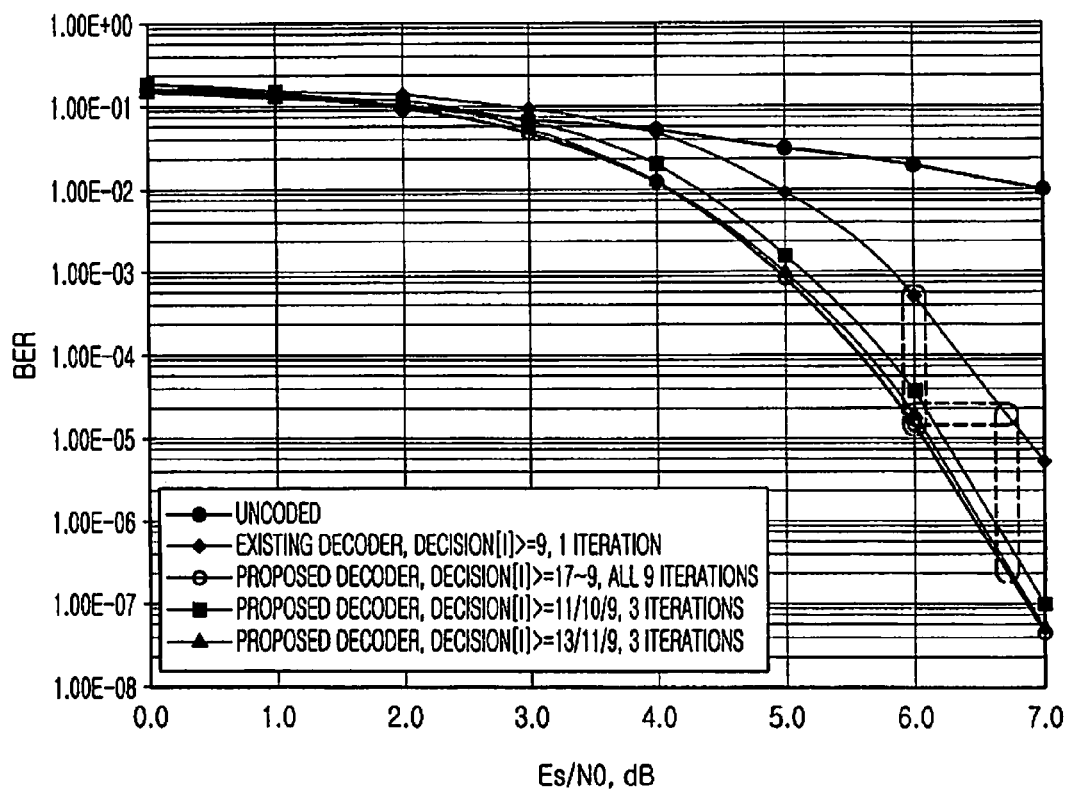
FIG. 5 is a diagram illustrating a BER simulation result obtained when an 'Uncorrectable Error Detected' flag is not used.

FIG. 5 is a diagram illustrating a BER simulation result obtained when an 'Uncorrectable Error Detected' flag is not used. More specifically, the simulation result of FIG. 5 shows performance improvement for a higher Signal-to-Noise Ratio (SNR) as the present invention acquires BER 1.54E-05 instead of 4.45E-04 (SNR=6 dB), or acquire 3.45E-08 rather than 3.92E-06 (SNR=7 dB).

Figure 6:
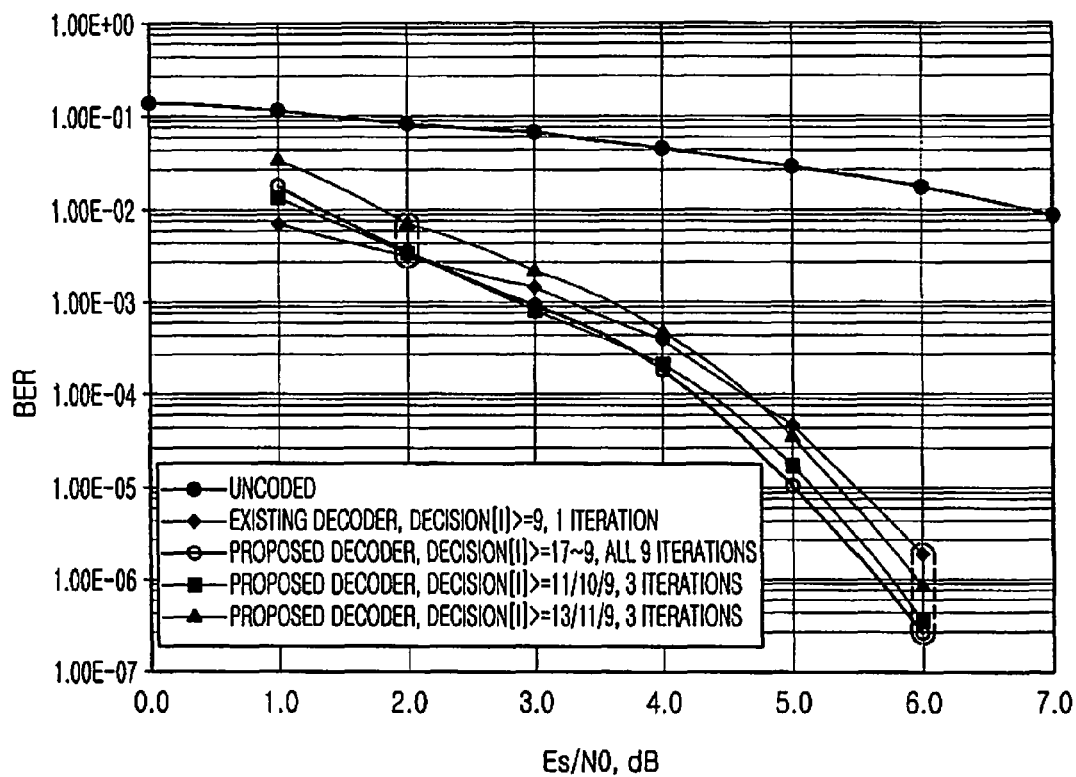
FIG. 6 is a diagram illustrating a BER simulation result obtained when an 'Uncorrectable Error Detected' flag is used.

FIG. 6 is a diagram illustrating a BER simulation result obtained when an 'Uncorrectable Error Detected' flag is used. Such an operation mode is suitable to a control channel for digital television or sound broadcasting, and when an uncorrected error pattern is detected, the decoded packet is omitted, and the decoding operation is iterated for the next packet. The proposed method is different from the conventional method in the foregoing aspects. This shows that the use of the proposed method can improve BER performance for an SNR higher than 2 dB. The iteration-9 decoder shows the best result for a higher SNR, but consumes high power due to the iteration-9 decoding. In this case, iteration-3 decoding is preferable as shown in Case 2.

As is apparent from the foregoing description, the present invention improves BER performance in decoding a PDSC code.

While the present invention has been shown and described with reference to certain preferred embodiments thereof, it will be understood by those skilled in the art that various changes in form and details may be made therein without departing from the spirit and scope of the present invention as defined by the appended claims.

What is claimed is:

1. A decoding method comprising:
    receiving codeword bits including null data bits;
    decoding the received codeword bits while shifting Bit Under Decoding (BUD) by one bit;
    performing error detection and correction on each BUD;
    detecting an uncorrectable error, when a BUD is a null decoding bit; and
    outputting a decoding result.

2. The decoding method of claim 1, wherein performing the error detection and correction comprises:
    calculating check results using a predetermined check equation;
    calculating a sum of the check results;
    determining if the sum of the check results is greater than or equal to a predetermined threshold; and
    when the sum of the check results is greater than or equal to the predetermined threshold, determining that an error is detected, setting an error detected flag, and correcting the detected error.

3. The decoding method of claim 2, further comprising:
    performing iterative decoding a predetermined number of times, while changing a value of the predetermined threshold, before outputting the decoding result.

4. The decoding method of claim 1, further comprising:
    setting an uncorrectable error detected flag, when the uncorrectable error is detected.

5. A decoding apparatus comprising:
    a decoder register for receiving data including a codeword including null data bits, and decoding the received data while shifting Bit Under Decoding (BUD) by one bit;
    a connection unit for applying a predetermined check equation to the data output from the decoder register and outputting check results;
    a majority logic unit for determining if an error is detected according to the check result output from the connection unit, and outputting a determination result; and
    an error information unit for determining if there is an error in the received data and if there is an uncorrectable error in the decoded data.

6. The decoding apparatus of claim 5, wherein the majority logic unit determines if a sum of the check results is greater than or equal to a predetermined threshold, and outputs that an error is detected, when the sum of the check results is greater than or equal to the threshold.

7. The decoding apparatus of claim 6, wherein the decoder register performs iterative decoding a predetermined number of times while changing a value of the predetermined threshold before outputting the decoding result.

8. The decoding apparatus of claim 5, wherein the error information unit sets an uncorrectable error detected flag when the uncorrectable error is detected.

* * * * *